United States Patent
Chiang et al.

(10) Patent No.: US 9,496,526 B2
(45) Date of Patent: Nov. 15, 2016

(54) APPARATUS AND METHOD FOR TAKING FLEXIBLE DISPLAY PANEL OFF, AND METHOD FOR MANUFACTURING THE SAME

(71) Applicant: AU Optronics Corporation, Hsin-Chu (TW)

(72) Inventors: Ming-Wei Chiang, Hsin-Chu (TW); Kuei-Ning Cheng, Hsin-Chu (TW); Pin-Fan Wang, Hsin-Chu (TW)

(73) Assignee: AU OPTRONICS CORPORATION, Hsin-Chu (TW)

( * ) Notice: Subject to any disclaimer, the term of this patent is extended or adjusted under 35 U.S.C. 154(b) by 225 days.

(21) Appl. No.: 14/324,559

(22) Filed: Jul. 7, 2014

(65) Prior Publication Data
US 2015/0255756 A1    Sep. 10, 2015

(30) Foreign Application Priority Data

Mar. 10, 2014  (TW) .............................. 103108196 A

(51) Int. Cl.
| | |
|---|---|
| *B32B 38/10* | (2006.01) |
| *H01L 51/56* | (2006.01) |
| *B32B 43/00* | (2006.01) |
| *H01L 51/00* | (2006.01) |
| *H01L 51/50* | (2006.01) |

(52) U.S. Cl.
CPC ............. *H01L 51/56* (2013.01); *B32B 43/006* (2013.01); *H01L 51/0024* (2013.01); *H01L 51/50* (2013.01); *B32B 38/10* (2013.01); *B32B 2457/20* (2013.01); *Y10T 156/1174* (2015.01); *Y10T 156/195* (2015.01)

(58) Field of Classification Search
CPC .................... Y10T 156/1168; Y10T 156/117; Y10T 156/19; Y10T 156/1944; Y10T 156/195; Y10T 156/19944; B32B 38/10; B32B 43/006
USPC .................................. 156/750, 755, 758, 759
See application file for complete search history.

(56) References Cited

U.S. PATENT DOCUMENTS

| | | | | |
|---|---|---|---|---|
| 5,879,505 A | * | 3/1999 | Fujisawa | ............ B41M 5/38207 156/715 |
| 8,469,076 B1 | * | 6/2013 | Zhong | ..................... B32B 38/10 156/714 |
| 2013/0048223 A1 | | 2/2013 | Ahn | |

FOREIGN PATENT DOCUMENTS

| | | |
|---|---|---|
| CN | 201107511 Y | 8/2008 |
| TW | I382923 | 1/2013 |
| TW | 201310744 | 3/2013 |
| TW | 201325904 | 7/2013 |

* cited by examiner

Primary Examiner — Carson Gross
(74) Attorney, Agent, or Firm — WPAT, PC; Justin King

(57) ABSTRACT

An apparatus for taking a flexible display panel off includes a roller, a linear motion member, a fastening apparatus and a first driving apparatus. The roller has a circumferential surface which allows a first portion of the flexible display panel to be wound thereon. The linear motion member has a carrying surface. A second portion of the flexible display panel is in contact with the carrying surface. The fastening apparatus is used to fasten the flexible display panel onto the carrying surface of the linear motion member. The first driving apparatus is used to drive the linear motion member to move linearly relative to the circumferential surface, so that the first portion departs from the circumferential surface and moves onto the carrying surface along with the second portion.

15 Claims, 8 Drawing Sheets

APPARATUS AND METHOD FOR TAKING FLEXIBLE DISPLAY PANEL OFF, AND METHOD FOR MANUFACTURING THE SAME

RELATED APPLICATIONS

This application claims priority to Taiwan Application Serial Number 103108196, filed Mar. 10, 2014, which is herein incorporated by reference.

BACKGROUND

1. Technical Field

The present disclosure relate to a flexible display panel. More particularly, the present disclosure relate to an apparatus and a method for taking a flexible display panel off, and a method for manufacturing the same.

2. Description of Related Art

Along with the progress of the display technology, a flexible display panel is now developed. When manufacturing an apparatus with the flexible display panel, a flexible substrate is in general placed onto a rigid substrate, and then, TFT and OLED can be formed onto the flexible substrate, so as to form the flexible display panel.

After the flexible display panel is manufactured, it is required to be taken off from the rigid substrate. A roller having a clamp may be utilized to take the flexible display panel off.

However, in the foregoing process, the size of the roller has to match the size of the flexible display panel. In other words, if it is desirable to take a larger flexible display panel, a roller having greater radius is required, so as to provide an area large enough to allow the flexible display panel to be wound on. However, the larger the roller is, the greater the space occupied by the roller is which requires more cost. Moreover, because the clamp has to roll along with the roller, the mechanism is complicated and thus increases the cost accordingly.

SUMMARY

It is therefore one of the objectives of the present disclosure provide an apparatus that can take a large flexible display panel off without changing the size of the roller.

Moreover, It is therefore another of the objectives of the present disclosure provide an apparatus that can take the flexible display panel off without rolling the clamp along with the roller.

In accordance with one embodiment of the present disclosure, an apparatus for taking a flexible display panel off includes a roller, a linear motion member, a fastening apparatus and a first driving apparatus. The roller has a circumferential surface, which is used to wind a first portion of the flexible display panel thereon. The linear motion member has a carrying surface. A second portion of the flexible display panel is in contact with the carrying surface. The fastening apparatus is used for fastening the flexible display panel onto the carrying surface of the linear motion member. The first driving apparatus is used for driving the linear motion member to move linearly relative to the circumferential surface, so as to make the first portion depart from the circumferential surface and move onto the carrying surface along with the second portion.

In accordance with another embodiment of the present disclosure, a method for taking a flexible display panel off includes the following steps. A first portion of the flexible display panel on a carrier board is wound to a roller. A second portion of the flexible display panel is fastened onto a linear motion member. The linear motion member is driven to move linearly relative to the roller, so as to make the first portion depart from the roller and move onto the linear motion member, and to make a remaining portion of the flexible display panel depart from the carrier board and wound to the roller.

In accordance with yet another embodiment of the present disclosure, a method for manufacturing a flexible display panel includes the following steps. A flexible substrate is formed onto a carrier board. At least one display element layer is formed onto the flexible substrate. Another flexible substrate is provided onto the display element layer. A display medium layer is sandwiched between the display element layer and the another flexible substrate, so that the flexible substrates are encapsulated as the flexible display panel. A guiding film is adhered onto the flexible display panel. A portion of the guiding film is fastened onto a linear motion member. Another portion of the guiding film is wound to a roller. The linear motion member is driven to move linearly relative to the roller and to move the guiding film, so as to make the flexible display panel depart from the carrier board.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiment, with reference made to the accompanying drawings as follows.

DETAILED DESCRIPTION

Figure 1:
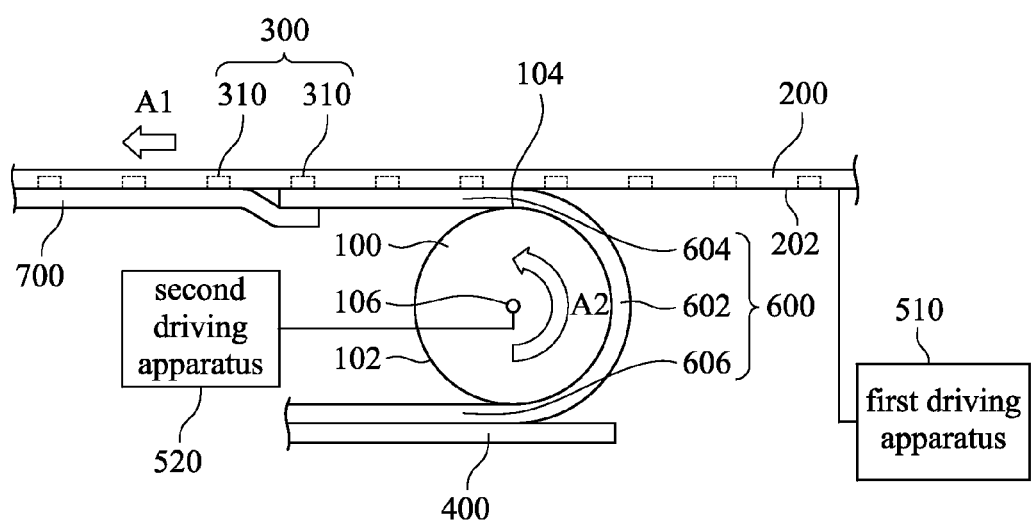
FIG. 1 is a side view of an apparatus for taking a flexible display panel off in accordance with one embodiment of the present disclosure.

Reference will now be made in detail to the present embodiments of the disclosure, examples of which are illustrated in the accompanying drawings. Wherever possible, the same reference numbers are used in the drawings and the description to refer to the same or like parts.

FIG. 1 is a side view of an apparatus for taking a flexible display panel 600 off in accordance with one embodiment of the present disclosure. As shown in FIG. 1, the apparatus includes a roller 100, a linear motion member 200, a fastening apparatus 300 and a first driving apparatus 510. The roller 100 has a circumferential surface 102. The linear motion member 200 has a carrying surface 202. The carrying surface 202 of the linear motion member 200 faces toward the roller 100. The linear motion member 200 and the roller 100 can cooperatively take the flexible display panel 600 off the carrier board 400.

In particular, the flexible display panel 600 includes a first portion 602, a second portion 604 and a remaining portion 606. The first portion 602 is connected between the second portion 604 and the remaining portion 606. At a transient moment during the period of taking the flexible display panel 600 off, the remaining portion 606 is located on the carrier board 400, and the first portion 602 is wound on the circumferential surface 102 of the roller 100, and the second portion 604 is in contact with the carrying surface 202 of the linear motion member 200. In detail, the flexible display panel 600 has a first surface (not marked) and a second surface (not marked) opposite to the first surface. The first surface faces to the circumferential surface 102, and therefore, at a transient moment during the process taking the flexible display panel 600 off, the second surface of the remaining portion 606 is in contact with the carrier board 400, and the first surface of the first portion 602 is in contact with the circumferential surface 102, and the second surface of the second portion 604 is in contact with the carrying surface 202 of the linear motion member 200. The fastening apparatus 300 can be used to fasten the flexible display panel 600 onto the carrying surface 202 of the linear motion member 200. The first driving apparatus 510 can be used to drive the linear motion member 200 to move linearly relative to the circumferential surface 102 of the roller 100, so as to make the first portion 602 of the flexible display panel 600 depart from the circumferential surface 102 and move onto the carrying surface 202 of the linear motion member 200 along with the second portion 604.

In the foregoing embodiment, because the fastening apparatus 300 fasten the second portion 604 of the flexible display panel 600 onto the linear motion member 200, the second portion 604 can move linearly along with the linear motion member 200. When the linear motion member 200 and the second portion 604 cooperatively move along a linear motion direction A1, the first portion 602 wound on the roller 100 can be moved onto the linear motion member 200 along with the second portion 604. Moreover, the remaining portion 606 on the carrier board 400 can be moved onto the roller 100, and then, the remaining portion 606 can be moved onto the linear motion member 200. As a result, the remaining portion on the carrier board 400 reduces gradually. When there is no remaining portion 606 on the carrier board 400, the process of taking the flexible display panel 600 off the carrier board 400 is completed.

In the foregoing embodiment, after the roller 100 winds the first portion 602 of the flexible display panel 600, the first portion 602 can be moved onto the linear motion member 200, and therefore, the apparatus can take the large flexible display panel 600 off without changing the size of the roller 100. Moreover, in the foregoing embodiment, the fastening apparatus 300 on the linear motion member 200 can fasten the flexible display panel 600, and therefore, the roller 100 does not require a clamp thereon, so as to reduce the cost.

In some embodiments, the fastening apparatus 300 includes at least one vacuum suction port 310 as an example. The vacuum suction port 310 is formed on the carrying surface 200 to provide vacuum suction force, so as to suck the second portion 604 on the carrying surface 202. In other embodiments, the fastening apparatus 300 may also utilize at least one vacuum sucker (or namely vacuum sucking disc) to suck the flexible display panel 600. As such, when the linear motion member 200 moves along the linear motion direction A1, it moves the second portion 604 of the flexible display panel 600 along the linear motion direction A1, so as to make the first portion 602 depart from the roller 100 and move onto the linear motion member 200, and to make the remaining portion 606 depart from the carrier board 400 and wound to the roller 100.

In some embodiments, the number of the vacuum suction port 310 is plural. These vacuum suction ports 310 can be arranged on the carrying surface 202 along the linear motion direction A1. As a result, when the first portion 602 of the flexible display panel 600 moves onto the carrying surface 202 along with the second portion 604, other vacuum suction ports 310 can exert the vacuum suction force to the first portion 602. In other words, the first portion 602 moving from the roller 100 onto the linear motion member 200 can also be sucked by the vacuum suction port 310, and therefore, it may not depart from the carrying surface 202 of the linear motion member 200. In some embodiments, the vacuum suction port 310 can be connected to an outer vacuum source (not shown), which can inhale air via the vacuum suction port 310, so as to provide the vacuum suction force.

In some embodiments, the roller 100 can roll relative to the carrier board 400, so as to make the remaining portion 606 of the flexible display panel 600 depart from the carrier board and wound to the roller 100. In particular, the apparatus includes a second driving apparatus 520 for driving the roller 100 to roll. More particularly, the second driving apparatus 520 can drive the roller 100 to roll along a circumferential direction A2, so as to wind the first portion 602 of the flexible display panel 600, and to wind the remaining portion 606 on the carrier board 400 to depart from the carrier board 400.

In some embodiments, the first driving apparatus 510 drives the linear motion member 200 to move at a linear speed, and the second driving apparatus 520 makes the circumferential surface 102 of the roller 100 roll at a tangential speed. The linear speed is greater than the tangential speed, so that the flexible display panel 600 can be tightly wound on the circumferential surface 102 of the roller 100. In particular, the circumferential surface 102 has a top portion 104. The top portion 104 is located on a position of the circumferential surface 102 that is farthest from the carrier board 400. When the roller 100 rolls, the top portion 104 of the circumferential surface 102 moves at the tangential speed. When the linear speed is greater than the tangential speed, the linear motion member 200 can tightly pull the flexible display panel 600, so that the flexible display panel 600 can be tightly wound on the circumferential surface 102 of the roller 100, thereby preventing the flexible display panel 600 on the circumferential surface 102 from loosening.

In some embodiments, the linear motion member 200 has a linear motion path. The linear motion path is defined along the linear motion direction A1. The roller 100 has a central axis 106. The central axis 106 has an axial direction. The linear motion path of the linear motion member 200 is across the roller 100 and perpendicular to an axial direction of the central axis 106 of the roller 100. As a result, the linear motion member 200 can move along the tangential direction of the circumferential surface 102 of the roller 100, so as to make the first portion 602 on the circumferential surface 102 move onto the linear motion member 200 along with the second portion 604.

In some embodiments, a minimal distance from the carrying surface 202 of the linear motion member 200 to the circumferential surface 102 of the roller 100 is not less than a thickness of the flexible display panel 600. In other words, the minimal distance from the carrying surface 202 of the linear motion member 200 to the top portion 104 of the circumferential surface 102 at least equals to the thickness of the flexible display panel 600. As a result, the gap between the linear motion member 200 and the roller 100 allows the flexible display panel 600 to pass therethrough, so that the first portion 602 and the remaining portion 606 of the flexible display panel 600 can move onto the linear motion member 200 along with the second portion 604.

Figure 2A:
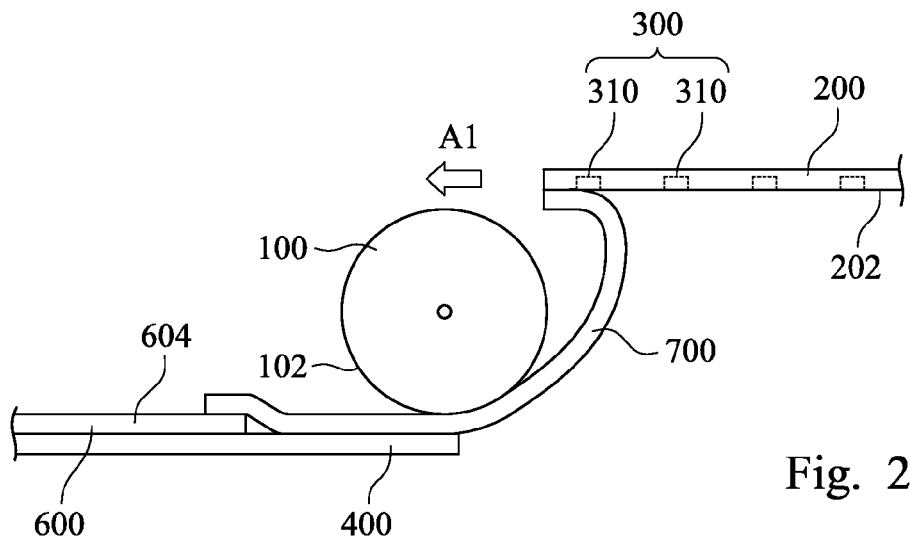
FIGS. 2A to 2C are side views at different steps of the method for taking the flexible display panel off in accordance with one embodiment of the present disclosure.

In some embodiments, a guiding film 700 can be utilized to lead the flexible display panel 600 to move to the roller 100 and the linear motion member 200. The detailed steps can be referred to FIGS. 2A to 2C, which are side views at different steps of the method for taking the flexible display panel 600 off in accordance with one embodiment of the present disclosure. As shown in FIG. 2A, the guiding film 700 can be adhered to the flexible display panel 600. In other words, the guiding film 700 has a first surface (not marked) and a second surface (not marked) opposite to the first surface. The first surface faces to the circumferential surface 102. The second surface of the guiding film 700 is in contact with and is adhered to the first surface of the flexible display panel 600. For example, the guiding film 700 can be adhered to the edge of the second portion 604 of the flexible display panel 600. Then, the guiding film 700 can be fastened onto the linear motion member 200. In particular, the fastening apparatus 300 can fasten a portion of the guiding film 700 onto the carrying surface 202 of the linear motion member 200. For example, the fastening apparatus 300 may include the vacuum suction port 310, which sucks a portion of the guiding film 700 onto the carrying surface 202. In other embodiments, the fastening apparatus 300 utilizes the vacuum sucker to suck the portion of the guiding film 700.

Figure 2B:
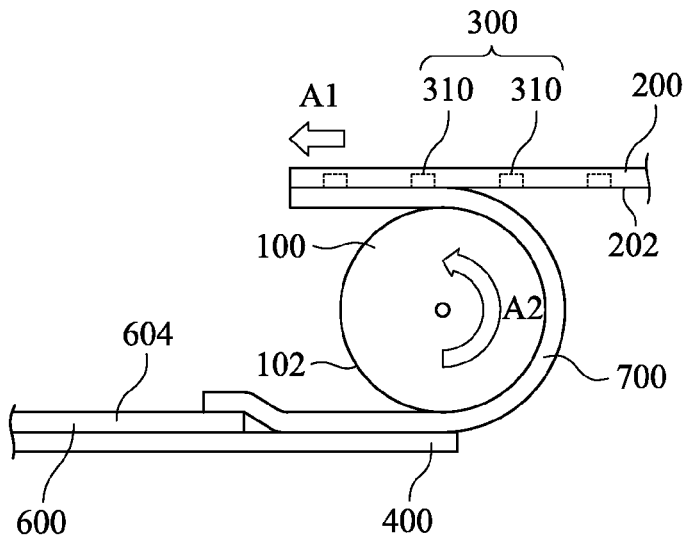

Then, as shown in FIG. 2B, another portion of the guiding film 700 is wound to the roller 100. For example, the linear motion member 200 can be driven to move linearly relative to the roller 100, such as moving along the linear motion direction A1, so that another portion of the guiding film 700 can be wound onto the circumferential surface 102 of the roller 100. When the guiding film 700 is wound onto the circumferential surface 102 of the roller 100, the roller 100 can be driven to roll along the circumferential direction A2, so as to wind the guiding film 700 on the carrier board 400.

Figure 2C:
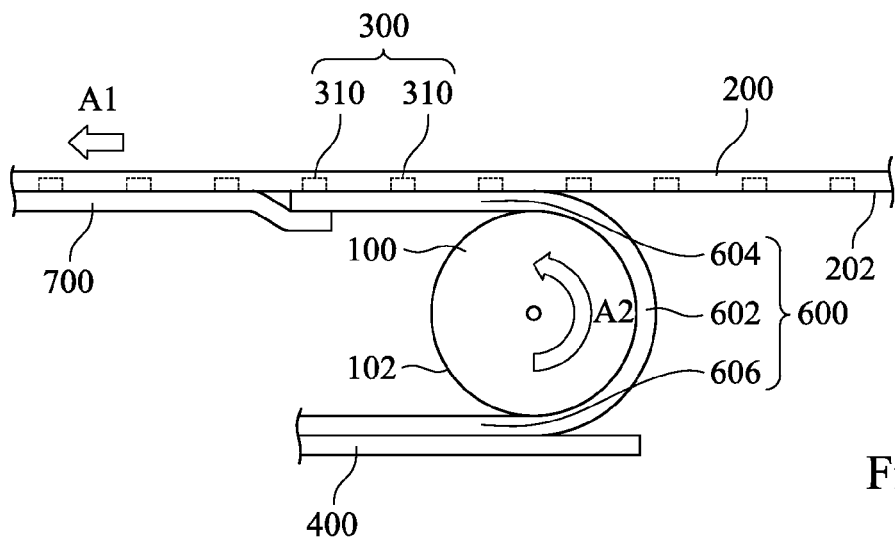

Then, as shown in FIG. 2C, the linear motion member 200 can be driven to move linearly relative to the roller 100, so as to move the guiding film 700 and thereby to make the flexible display panel 600 depart from the carrier board 400. In particular, because the guiding film 700 is adhered to the second portion 604 of the flexible display panel 600, when the linear motion member 200 moves along the linear motion direction A1, the guiding film 700 can lead the second portion 604 on the carrier board 400 to move and make the second portion 604 move across the roller 100 onto the linear motion member 200. The fastening apparatus 300 can fasten the second portion 604 onto the carrying surface 202 of the linear motion member 200. For example, the fastening apparatus 300 may include the vacuum suction port 310, which sucks the second portion 604 onto the carrying surface 202. In other embodiments, the fastening apparatus may utilize the vacuum sucker to suck the flexible display panel 600.

Then, as shown in FIG. 2C, when the second portion 604 of the flexible display panel 600 moves onto the linear motion member 200, it can lead the first portion 602 on the carrier board 400 to move onto the circumferential surface 102 of the roller 100, and makes the first portion 602 wound onto the circumferential surface 102 of the roller 100.

Then, as shown in FIG. 2C, when the linear motion member 200 keeps moving along the linear motion direction A1, it makes the first portion 602 of the flexible display panel 600 depart from the roller 100 and move onto the linear motion member 200, so that the remaining portion 606 of the flexible display panel 600 can depart from the carrier board 400 and be wound onto the circumferential surface 102 of the roller 100, so as to further move onto the linear motion member 200.

Finally, the linear motion member 200 can keep moving along the linear motion direction A1 to make the remaining portion 606 on the carrier board 400 reduce gradually. When the carrier board 400 has no remaining portion 606 thereon, the process for taking the flexible display panel 600 off the carrier board 400 is completed. In some embodiments, when desiring to take the remaining portion 606 of the flexible display panel 600 off the carrier board 400, the roller 100 can be driven to roll, so as to wind the remaining portion 606 on the carrier board 400.

Figure 3:
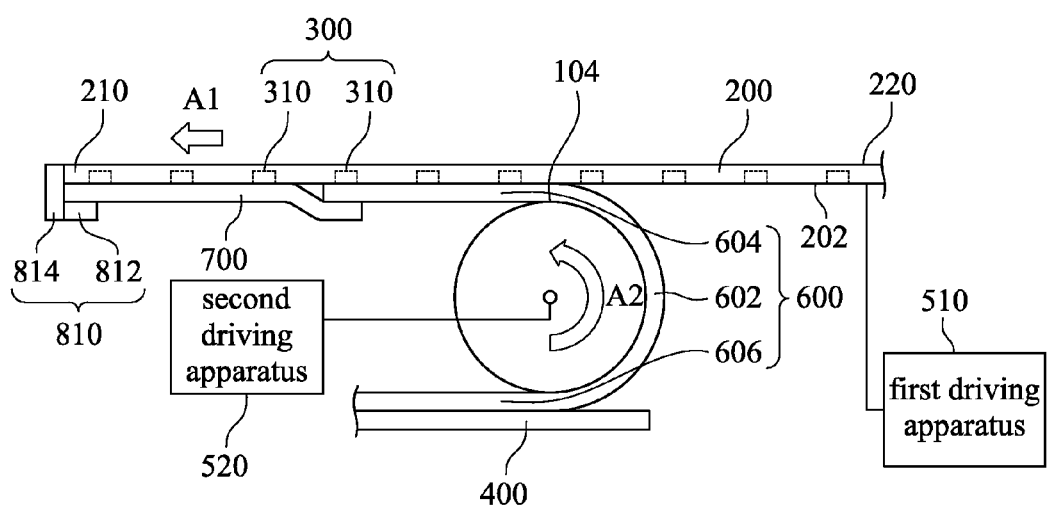
FIG. 3 is a side view of an apparatus for taking the flexible display panel off in accordance with another embodiment of the present disclosure.

FIG. 3 is a side view of an apparatus for taking the flexible display panel 600 off in accordance with another embodiment of the present disclosure. As shown in FIG. 3, the main difference between this embodiment and previous embodiments is that: the apparatus in this embodiment further includes a pressing mechanism 810. The pressing mechanism 810 is used to press the guiding film 700 against the carrying surface 202 of the linear motion member 200. In other words, not only the vacuum suction port 310 sucks the guiding film 700 onto the carrying surface 202, but also the pressing mechanism 810 presses the guiding film 700 against the carrying surface 202. As a result, the guiding film 700 can be securely fastened onto the carrying surface 202.

In some embodiments, the linear motion member 200 has a front end 210 and a rear end 220 opposite to each other. The first driving apparatus 510 is used to drive the linear motion member 200 to move along a direction from the rear end 220 to the front end 210. In other words, the linear motion direction A1 is defined along the direction from the rear end 220 to the front end 210. The pressing mechanism 810 is located on the front end 210, so as to press the guiding film 700 against the carrying surface 202 at the front end 210.

For example, the pressing mechanism 810 includes a pressing member 812 and a fixture 814. The pressing member 812 is movably disposed on the fixture 814. The pressing member 812 is disposed under the carrying surface 202 at the front end 210, and it can move toward or away from the carrying surface 202. When desiring to fasten the guiding film 700, the pressing member 812 can move toward the carrying surface 202, so as to press the guiding film 700 against the carrying surface 202.

Figure 4A:
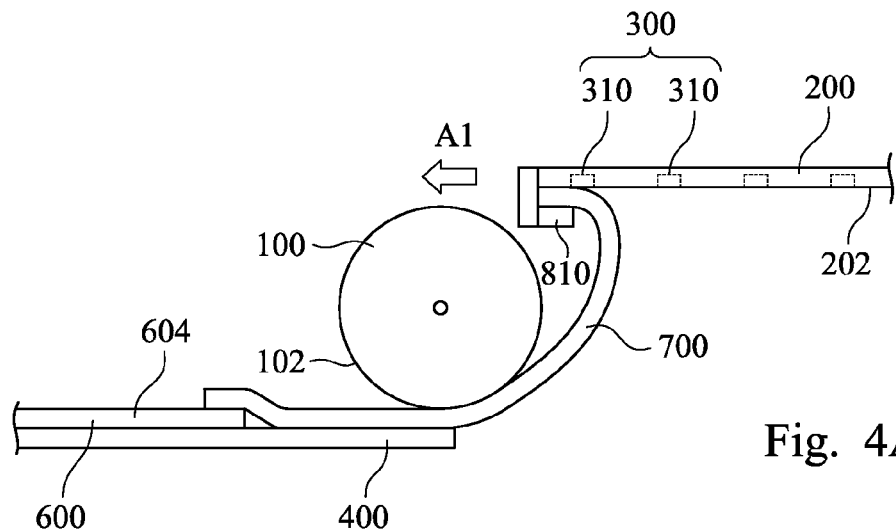
FIGS. 4A to 4C are side views at different steps of the method for taking the flexible display panel off in accordance with another embodiment of the present disclosure.
Figure 4B:
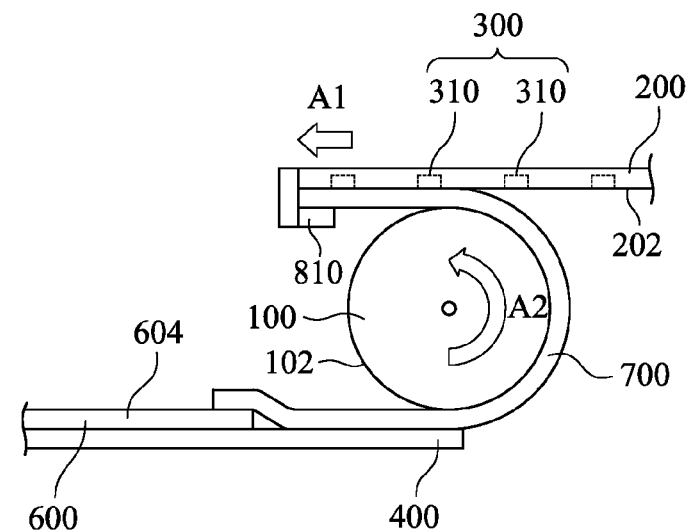
Figure 4C:
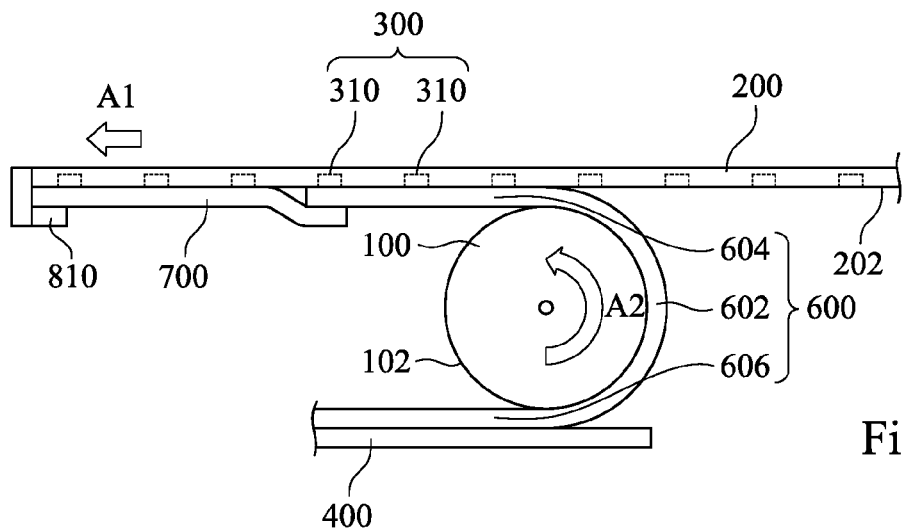

FIGS. 4A to 4C are side views at different steps of the method for taking the flexible display panel 600 off in accordance with another embodiment of the present disclosure. As shown in FIG. 4A, the guiding film 700 can be adhered to the flexible display panel 600. For example, the guiding film 700 can be adhered to the edge of the second portion 604 of the flexible display panel 600. Then, a portion of the guiding film 700 can be fastened onto the linear motion member 200. In particular, the vacuum suction port 310 can fasten a portion of the guiding film 700 onto the carrying surface 202 of the linear motion member 200. Moreover, the pressing mechanism 810 can press a portion of the guiding film 700 against the carrying surface 202 of the linear motion member 200. In other embodiments, the fastening apparatus 300 utilizes the vacuum sucker to suck the portion of the guiding film 700 and the flexible display panel 600.

Then, as shown in FIG. 4B, another portion of the guiding film 700 is wound to the roller 100. For example, the linear motion member 200 can be driven to move linearly relative to the roller 100, such as moving along the linear motion direction A1, so that another portion of the guiding film 700 can be wound onto the circumferential surface 102 of the roller 100. When the guiding film 700 is wound onto the circumferential surface 102 of the roller 100, the roller 100 can be driven to roll along the circumferential direction A2, so as to wind the guiding film 700 on the carrier board 400.

Then, as shown in FIG. 4C, the linear motion member 200 can be driven to move linearly relative to the roller 100, so as to move the guiding film 700 and thereby to make the flexible display panel 600 depart from the carrier board 400. In particular, because the guiding film 700 is adhered to the second portion 604 of the flexible display panel 600, when the linear motion member 200 moves along the linear motion direction A1, the guiding film 700 can lead the second portion 604 on the carrier board 400 to move and make the second portion 604 move across the roller 100 onto the linear motion member 200. The fastening apparatus 300 can fasten the second portion 604 onto the carrying surface 202 of the linear motion member 200.

Then, as shown in FIG. 4C, when the second portion 604 of the flexible display panel 600 moves onto the linear motion member 200, it can lead the first portion 602 on the carrier board 400 to move onto the circumferential surface 102 of the roller 100, and makes the first portion 602 wound onto the circumferential surface 102 of the roller 100.

Then, as shown in FIG. 4C, when the linear motion member 200 keeps moving along the linear motion direction A1, it makes the first portion 602 of the flexible display panel 600 depart from the roller 100 and move onto the linear motion member 200, so that the remaining portion 606 of the flexible display panel 600 can depart from the carrier board 400 and be wound onto the circumferential surface 102 of the roller 100, so as to further move onto the linear motion member 200.

Finally, the linear motion member 200 can keep moving along the linear motion direction A1 to make the remaining portion 606 on the carrier board 400 reduce gradually. When the carrier board 400 has no remaining portion 606 thereon, the process for taking the flexible display panel 600 off the carrier board 400 is completed.

Figure 5:
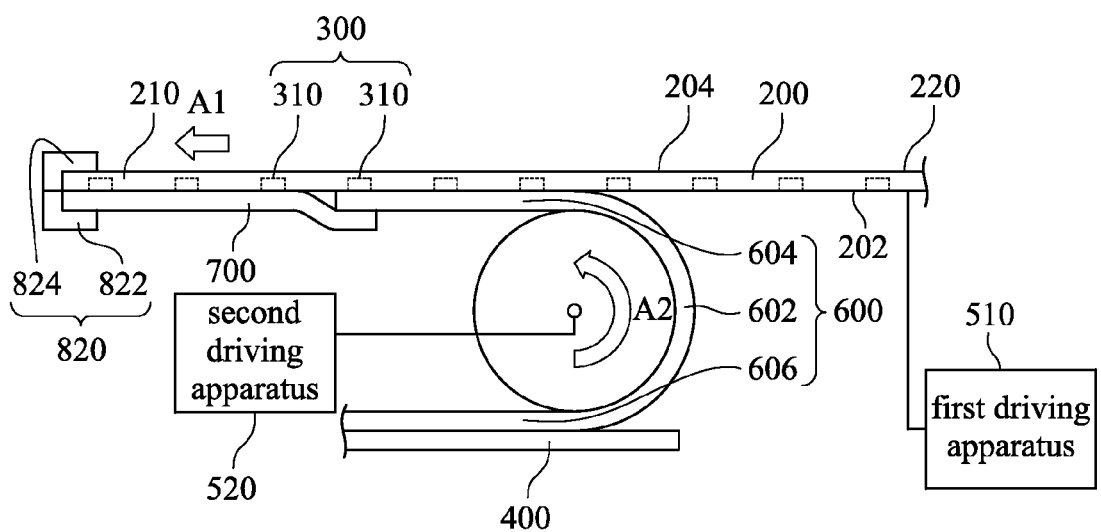
FIG. 5 is a side view of an apparatus for taking the flexible display panel off in accordance with another embodiment of the present disclosure.

FIG. 5 is a side view of an apparatus for taking the flexible display panel 600 off in accordance with another embodiment of the present disclosure. As shown in FIG. 5, the main difference between this embodiment and previous embodiments is that: the apparatus in this embodiment further includes a clamp 820. The clamp 820 is used to clamp the linear motion member 200 and the guiding film 700. In other words, not only the vacuum suction port 310 or the vacuum sucker sucks the guiding film 700 onto the carrying surface 202, but also the clamp 820 clamps the guiding film 700 and the linear motion member 200. As a result, the guiding film 700 can be securely fastened onto the carrying surface 202.

In some embodiments, the clamp 820 is located on the front end 210, so as to clamp the guiding film 700 and the linear motion member 200. For example, the clamp 820 has two clamping members 822 and 824. The clamping members 822 and 824 are located on the front end 210, and they can approach each other or move away from each other. The linear motion member 200 has a back surface 204. The back surface 204 is opposite to the carrying surface 202. The clamping member 822 is at least partially located under the carrying surface 202, and the clamping member 824 is at least partially located above the back surface 204. When the guiding film 700 is located on the carrying surface 202, the clamping members 822 and 824 can move toward each other, such that the clamping member 822 can press the guiding film 700 against the carrying surface 202 at the front end 210, and the clamping member 824 can press against the back surface 204 at the front end 210.

Figure 6A:
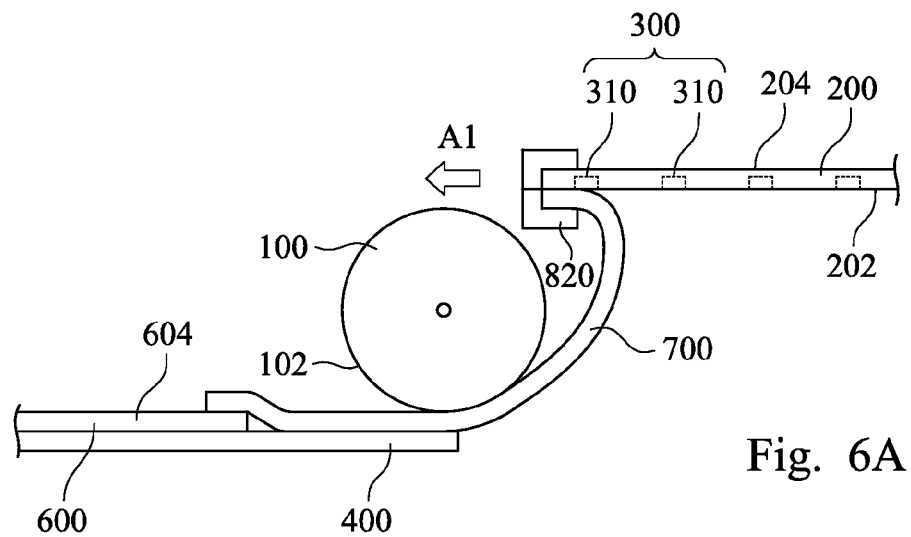
FIGS. 6A to 6C are side views at different steps of the method for taking the flexible display panel off in accordance with another embodiment of the present disclosure.
Figure 6B:
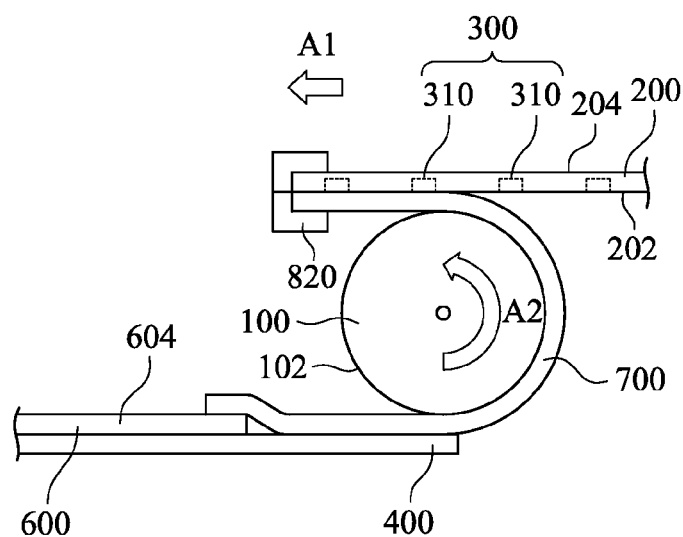
Figure 6C:
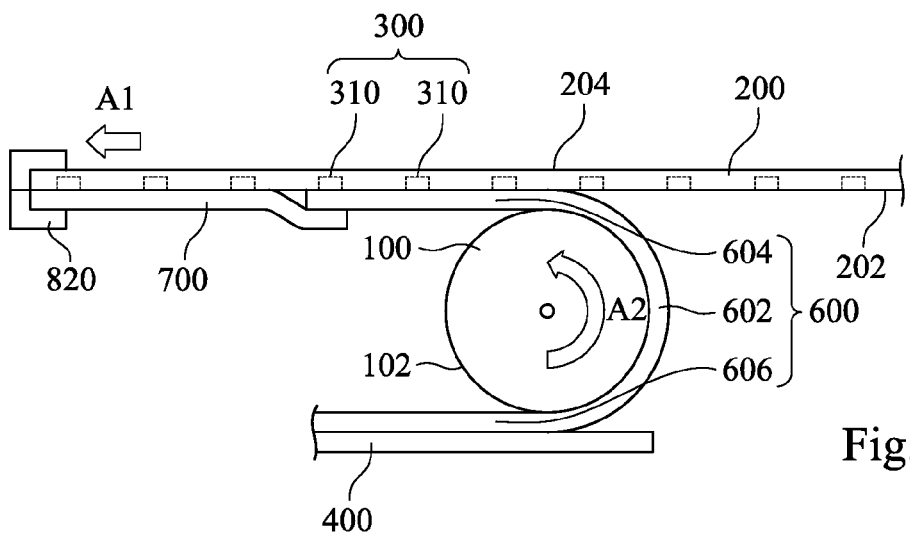

FIGS. 6A to 6C are side views at different steps of the method for taking the flexible display panel 600 off in accordance with another embodiment of the present disclosure. As shown in FIG. 6A, the guiding film 700 can be adhered to the flexible display panel 600. For example, the guiding film 700 can be adhered to the edge of the second portion 604 of the flexible display panel 600. Then, a portion of the guiding film 700 can be fastened onto the linear motion member 200. In particular, the vacuum suction port 310 or the vacuum sucker can fasten a portion of the guiding film 700 onto the carrying surface 202 of the linear motion member 200. Moreover, the clamp 820 can clamp the guiding film 700 and the linear motion member 200.

Then, as shown in FIG. 6B, another portion of the guiding film 700 is wound to the roller 100. For example, the linear motion member 200 can be driven to move linearly relative to the roller 100, such as moving along the linear motion direction A1, so that another portion of the guiding film 700 can be wound onto the circumferential surface 102 of the roller 100. When the guiding film 700 is wound onto the circumferential surface 102 of the roller 100, the roller 100 can be driven to roll along the circumferential direction A2, so as to wind the guiding film 700 on the carrier board 400.

Then, as shown in FIG. 6C, the linear motion member 200 can be driven to move linearly relative to the roller 100, so as to move the guiding film 700 and thereby to make the flexible display panel 600 depart from the carrier board 400. In particular, because the guiding film 700 is adhered to the second portion 604 of the flexible display panel 600, when the linear motion member 200 moves along the linear motion direction A1, the guiding film 700 can lead the second portion 604 on the carrier board 400 to move and make the second portion 604 move across the roller 100 onto the linear motion member 200. The fastening apparatus 300 can fasten the second portion 604 onto the carrying surface 202 of the linear motion member 200.

Then, as shown in FIG. 6C, when the second portion 604 of the flexible display panel 600 moves onto the linear motion member 200, it can lead the first portion 602 on the carrier board 400 to move onto the circumferential surface 102 of the roller 100, and makes the first portion 602 wound onto the circumferential surface 102 of the roller 100.

Then, as shown in FIG. 6C, when the linear motion member 200 keeps moving along the linear motion direction A1, it makes the first portion 602 of the flexible display panel 600 depart from the roller 100 and move onto the linear motion member 200, so that the remaining portion 606 of the flexible display panel 600 can depart from the carrier board 400 and be wound onto the roller 100, so as to further move onto the linear motion member 200.

Finally, the linear motion member 200 can keep moving along the linear motion direction A1 to make the remaining portion 606 on the carrier board 400 reduce gradually. When the carrier board 400 has no remaining portion 606 thereon, the process for taking the flexible display panel 600 off the carrier board 400 is completed.

Figure 7A:
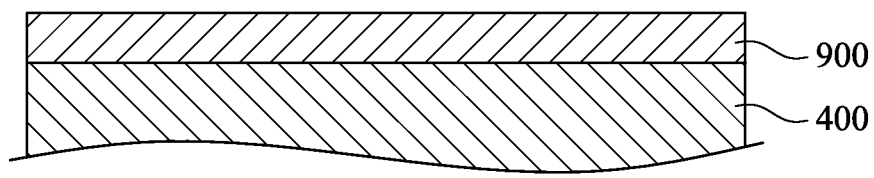
FIGS. 7A to 7F are cross-sectional views at different steps of the method for manufacturing the flexible display panel in accordance with one embodiment of the present disclosure.

FIGS. 7A to 7F are cross-sectional views at different steps of the method for manufacturing the flexible display panel 600 in accordance with one embodiment of the present disclosure. As shown in FIG. 7A, a release layer (or namely separation layer) 900 can be formed onto the carrier board 400. In some embodiments, the material of the release layer 900 can be, but is not limited to be, for example, silicon nitride or titanium dioxide.

Figure 7B:
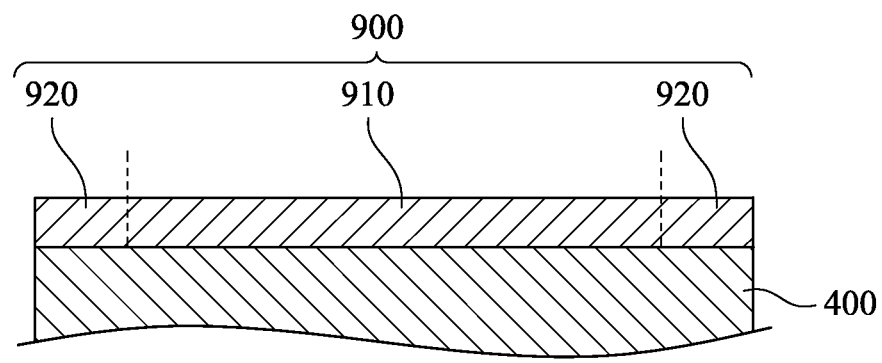

Then, as shown in FIG. 7B, the release layer 900 can be processed to generate an adhering zone 910 and a release zone 920. An adhering force that the adhering zone 910 exerts to the carrier board 400 is greater than an adhering force that the release zone 910 exerts to the carrier board 400. For example, the adhering zone 920 is formed by emitting ultraviolet lights. In detail, a partial zone of the release layer 900 can be emitted by ultraviolet lights, so as to improve the adhering force that the partial zone exerts to the carrier board 400, thereby forming the adhering zone 920. Moreover, another zone not emitted by the ultraviolet lights can be the release zone 910. The release layer 900 allows the manufacturer to manufacture the flexible display panel 600 (not shown in this figure) thereon. Because the adhering zone 920 is adhered to the carrier board 400, it can prevent the release layer 900 and the flexible display panel 600 thereon from moving freely.

Figure 7C:
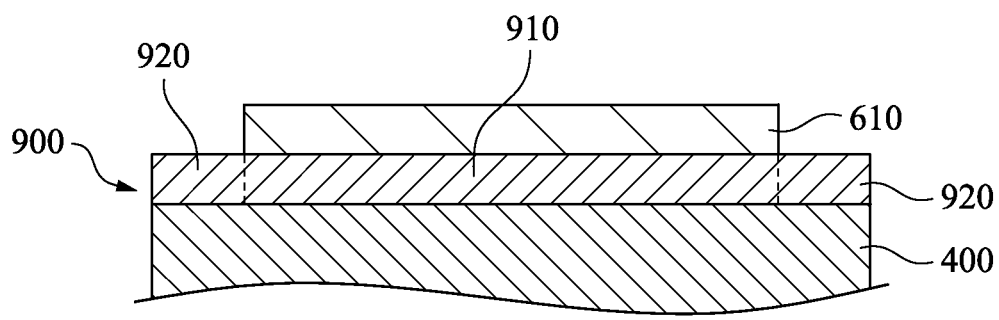

Then, as shown in FIG. 7C, a flexible substrate 610 can be formed onto the release layer 900. In particular, the flexible substrate 610 can be formed onto the release zone 910 of the release layer 900. Because the release zone 910 exerts lower adhering force to the carrier board 400, it can be easily taken off along with the flexible display panel 600 (not shown in this figure).

Figure 7D:
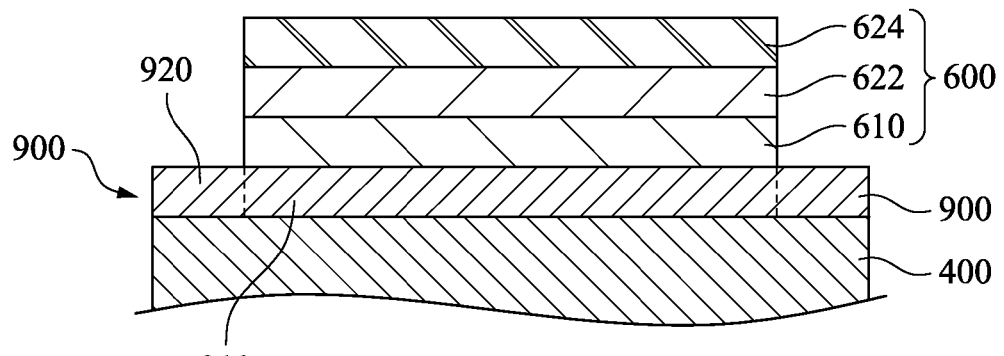

Then, as shown in FIG. 7D, a display element layer 622 and another flexible substrate 624 can be formed onto the flexible substrate 610. In some embodiments, the display element layer 622 includes a TFT array as an active-array layer and a display medium layer (not marked). The display medium layer is sandwiched between the display element layer 622 and the another flexible substrate 624, so that the flexible substrates 624 and 610 can be encapsulated as the flexible display panel 600. The display medium layer includes organic light-emitting materials, inorganic light-emitting materials, liquid crystal materials, electro-wetting materials, electro chromic materials, electrophoretic materials, or the like, or any combination thereof.

Figure 7E:
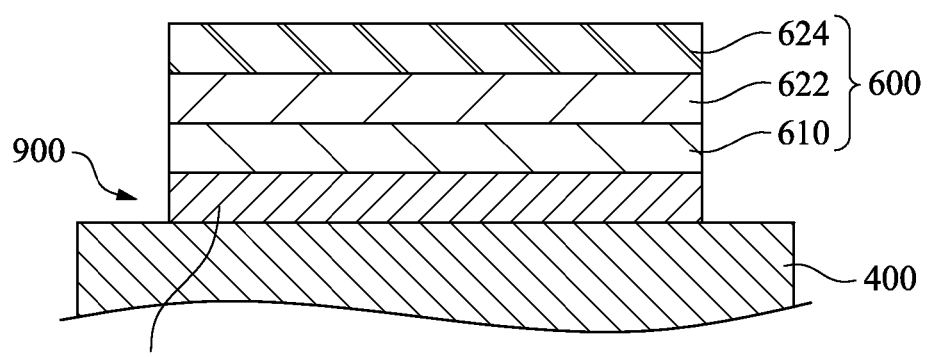

Then, as shown in FIG. 7E, the adhering zone 920 (See FIG. 7D) of the release layer 900 can be removed, thereby remaining the release zone 910 and the flexible display panel 600 thereon. For example, the adhering zone 920 can be cut by punching it. As such, the release layer 900 only remains the release zone 910 having lower adhering force, so that it can be easily taken off along with the flexible display panel 600.

Figure 7F:
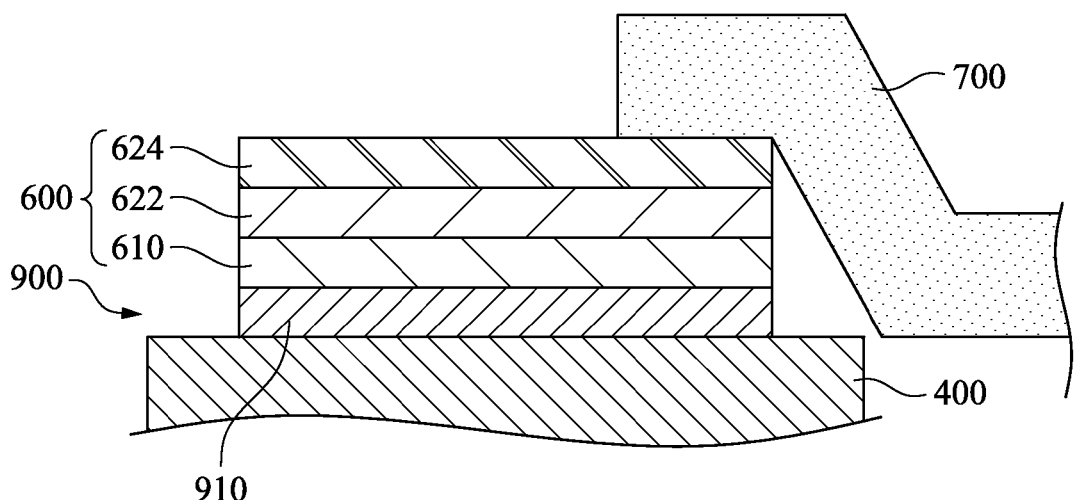

Then, as shown in FIG. 7F, the guiding film 700 can be adhered to the flexible display panel 600. For example, the guiding film 700 can be adhered to the flexible substrate 624. Then, steps in FIGS. 2A to 2C, steps in FIGS. 4A to 4C, or steps in FIGS. 6A to 6C can be performed to fasten a portion of the guiding film 700 onto the linear motion member 200, and to wind another portion of the guiding film 700 to the roller 100, and to drive the linear motion member 200 to move linearly relative to the roller 100, so that the guiding film 700, the flexible display panel 600 and the release zone 910 of the release layer 900 can depart from the carrier board 400.

In the foregoing embodiments, after the roller winds a portion of the flexible display panel, the portion of the flexible display panel can be moved onto the linear motion member, and therefore, the apparatus can take the large flexible display panel off without changing the size of the roller. Moreover, the fastening apparatus on the linear motion member can fasten the flexible display panel or the guiding film, and therefore, the roller does not require a clamp thereon, so that the clamp rolling along with the roller in the prior art can be omitted.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. An apparatus for taking a flexible display panel off, comprising:
   a roller having a circumferential surface, the circumferential surface being used to wind a first portion of the flexible display panel thereon;
   a linear motion member having a carrying surface, wherein a second portion of the flexible display panel is in contact with the carrying surface;
   a fastening apparatus for fastening the flexible display panel onto the carrying surface of the linear motion member;
   a first driving apparatus for driving the linear motion member to move linearly relative to the circumferential surface, so as to make the first portion depart from the circumferential surface and move onto the carrying surface along with the second portion; and
   a pressing mechanism for pressing a guiding film adhered to the flexible display panel against the carrying surface.

2. The apparatus of claim 1, wherein the fastening apparatus comprises at least one vacuum suction port or at least one vacuum sucker formed on the carrying surface.

3. The apparatus of claim 1, wherein the first driving apparatus is used to drive the linear motion member to move at a linear speed, and the apparatus for taking the flexible display panel further comprises:
   a second driving apparatus for driving the roller to make the circumferential surface roll at a tangential speed, wherein the linear speed is greater than the tangential speed.

4. The apparatus of claim 1, wherein a minimal distance from the carrying surface of the linear motion member to the circumferential surface of the roller is not less than a thickness of the flexible display panel.

5. The apparatus of claim 1, wherein a linear motion path of the linear motion member is across the roller and substantially perpendicular to an axial direction of the roller.

6. A method for manufacturing a flexible display panel, the method comprising:

providing the apparatus for taking a flexible display panel off of claim 1;

(a) forming a flexible substrate onto a carrier board;

(b) forming one display element layer onto the flexible substrate, and providing another flexible substrate onto the display element layer, and sandwiching a display medium layer between the display element layer and the another flexible substrate, so that the flexible substrates are encapsulated as the flexible display panel;

(c) adhering a guiding film onto the flexible display panel;

(d) fastening a portion of the guiding film onto a linear motion member;

(e) winding another portion of the guiding film to a roller; and (f) driving the linear motion member to move linearly relative to the roller and to move the guiding film, so as to make the flexible display panel depart from the carrier board.

7. The method of claim 6, wherein the step (a) comprises:

forming a release layer onto the carrier board; and forming the flexible substrate onto the release layer.

8. The method of claim 7, further comprising:

processing the release layer to generate an adhering zone and a release zone, wherein an adhering force that the adhering zone exerts to the carrier board is greater than an adhering force that the release zone exerts to the carrier board; and removing the adhering zone of the release layer before the linear motion member moves linearly.

9. The method of claim 8, wherein the adhering zone is formed by emitting ultraviolet lights.

10. An apparatus for taking a flexible display panel off, comprising:

a roller having a circumferential surface, the circumferential surface being used to wind a first portion of the flexible display panel thereon;

a linear motion member having a carrying surface, wherein a second portion of the flexible display panel is in contact with the carrying surface;

a fastening apparatus for fastening the flexible display panel onto the carrying surface of the linear motion member;

a first driving apparatus for driving the linear motion member to move linearly relative to the circumferential surface, so as the make the first portion depart from the circumferential surface and move onto the carrying surface along with the second portion;

a clamp for clamping the linear motion member and a guiding film adhered to the flexible display panel.

11. The apparatus of claim 10, wherein the linear motion member has a front end and a rear end, wherein the first driving apparatus is used to drive the linear motion member to move along a direction from the rear end to the front end, and the clamp is located on the front end.

12. The apparatus of claim 10, wherein the fastening apparatus comprises at least one vacuum suction port or at least one vacuum sucker formed on the carrying surface.

13. The apparatus of claim 10, wherein the first driving apparatus is used to drive the linear motion member to move at a linear speed, and the apparatus for taking the flexible display panel further comprises:

a second driving apparatus for driving the roller to make the circumferential surface roll at a tangential speed, wherein the linear speed is greater than the tangential speed.

14. The apparatus of claim 10, wherein a minimal distance from the carrying surface of the linear motion member to the circumferential surface of the roller is not less than a thickness of the flexible display panel.

15. The apparatus of claim 10, wherein a linear motion path of the linear motion member is across the roller and substantially perpendicular to an axial direction of the roller.

* * * * *